United States Patent
Ohno (10) Patent No.: US 8,134,178 B2
(45) Date of Patent: Mar. 13, 2012

(54) LIGHT-EMITTING ELEMENT

(75) Inventor: Seiji Ohno, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 175 days.

(21) Appl. No.: 12/695,218

(22) Filed: Jan. 28, 2010

(65) Prior Publication Data

US 2011/0062451 A1     Mar. 17, 2011

(30) Foreign Application Priority Data

Sep. 17, 2009   (JP) ................... 2009-216045

(51) Int. Cl.
*H01L 29/66*     (2006.01)

(52) U.S. Cl. ........ 257/157; 257/192; 257/280; 257/477; 257/E33.047

(58) Field of Classification Search ............. 257/79, 257/115, 157, 183, 192, 194, 280, 471, 477, 257/E33.047
See application file for complete search history.

(56) References Cited

U.S. PATENT DOCUMENTS

| | | | |
|---|---|---|---|
| 6,180,960 B1 * | 1/2001 | Kusuda et al. | 257/91 |
| 2005/0224810 A1 | 10/2005 | Ohno | |
| 2006/0001171 A1 | 1/2006 | Ohno et al. | |
| 2007/0057279 A1 | 3/2007 | Ohno | |
| 2009/0166646 A1 | 7/2009 | Ohno | |

FOREIGN PATENT DOCUMENTS

| | | |
|---|---|---|
| JP | 2003-249681 | 9/2003 |
| JP | 2005-340767 | 12/2005 |
| JP | 2007-250853 | 9/2007 |

* cited by examiner

*Primary Examiner* — Evan Pert
*Assistant Examiner* — Scott R Wilson
(74) *Attorney, Agent, or Firm* — Fildes & Outland, P.C.

(57) ABSTRACT

According to an aspect of the invention, a light-emitting element includes a shift thyristor, a light emitting thyristor, and a vertical type gate load resistor. The shift thyristor includes a first anode layer, a first gate layer, and a first cathode layer. The light-emitting thyristor includes a second anode layer, a second gate layer, and a second cathode layer. The vertical type gate load resistor is arranged on the first gate layer under a power line and limits a current flowing from the first gate layer and the second gate layer to the power line.

4 Claims, 11 Drawing Sheets

FIG. 5
I-V CHARACTERISTICS OF SCHOTTKY DIODE

LIGHT-EMITTING ELEMENT

CROSS-REFERENCE TO RELATED APPLICATIONS

This application is based upon and claims priority under 35 USC 119 from Japanese Patent Application No. 2009-216045, filed Sep. 17, 2009.

BACKGROUND

1. Technical Field

The present invention relates to a light-emitting element.

2. Related Art

Optical writing heads of optical printers or the like employ self-scanning-type light-emitting element arrays. Such a self-scanning-type light-emitting element array includes a plurality of elements, which emit light sequentially. Each element includes: a light-emitting thyristor of pnpn structure serving as a light-emitting element; and a shift thyristor for sequentially shifting supply of electric power to each light-emitting thyristor.

Here, for each light-emitting thyristor, when the corresponding shift thyristor becomes ON, the gate voltage increases so that the light-emitting thyristor becomes to an ON-ready state. On the other hand, when the adjacent shift thyristor becomes ON, the light-emitting thyristor having already been ON need be turned OFF. For the purpose of this, a gate load resistor is necessary that maintains the gate voltage at the high voltage when the shift thyristor is ON and that allows a current to flow to the power supply in order to rapidly reduce the gate voltage of the light-emitting thyristor when the shift thyristor becomes OFF.

SUMMARY OF THE INVENTION

According to an aspect of the invention, a light-emitting element includes a shift thyristor, a light emitting thyristor, and a vertical type gate load resistor. The shift thyristor includes a first anode layer, a first gate layer, and a first cathode layer and is turned ON and OFF in accordance with a potential of the first gate layer in a state that a voltage is applied between the first anode layer and the first cathode layer. The light-emitting thyristor includes a second anode layer, a second gate layer, and a second cathode layer and is turned ON in response to the potential of the second gate layer when the shift thyristor becomes ON, the second gate layer being provided as a common layer to the first gate layer, one of the second anode layer and the second cathode layer being provided as a common layer to the first anode layer or the first cathode layer, the other one of the second anode layer and the second cathode layer being provided as a layer separate from the first anode layer and the first cathode layer. The vertical type gate load resistor is arranged on the first gate layer under a power line and that limits a current flowing from the first gate layer and the second gate layer to the power line.

BRIEF DESCRIPTION OF THE DRAWINGS

Exemplary embodiments of the invention will be described in detail based on the following figures, wherein.

DETAILED DESCRIPTION

Exemplary embodiments of the present invention are described below with reference to the drawings.

Figure 1:
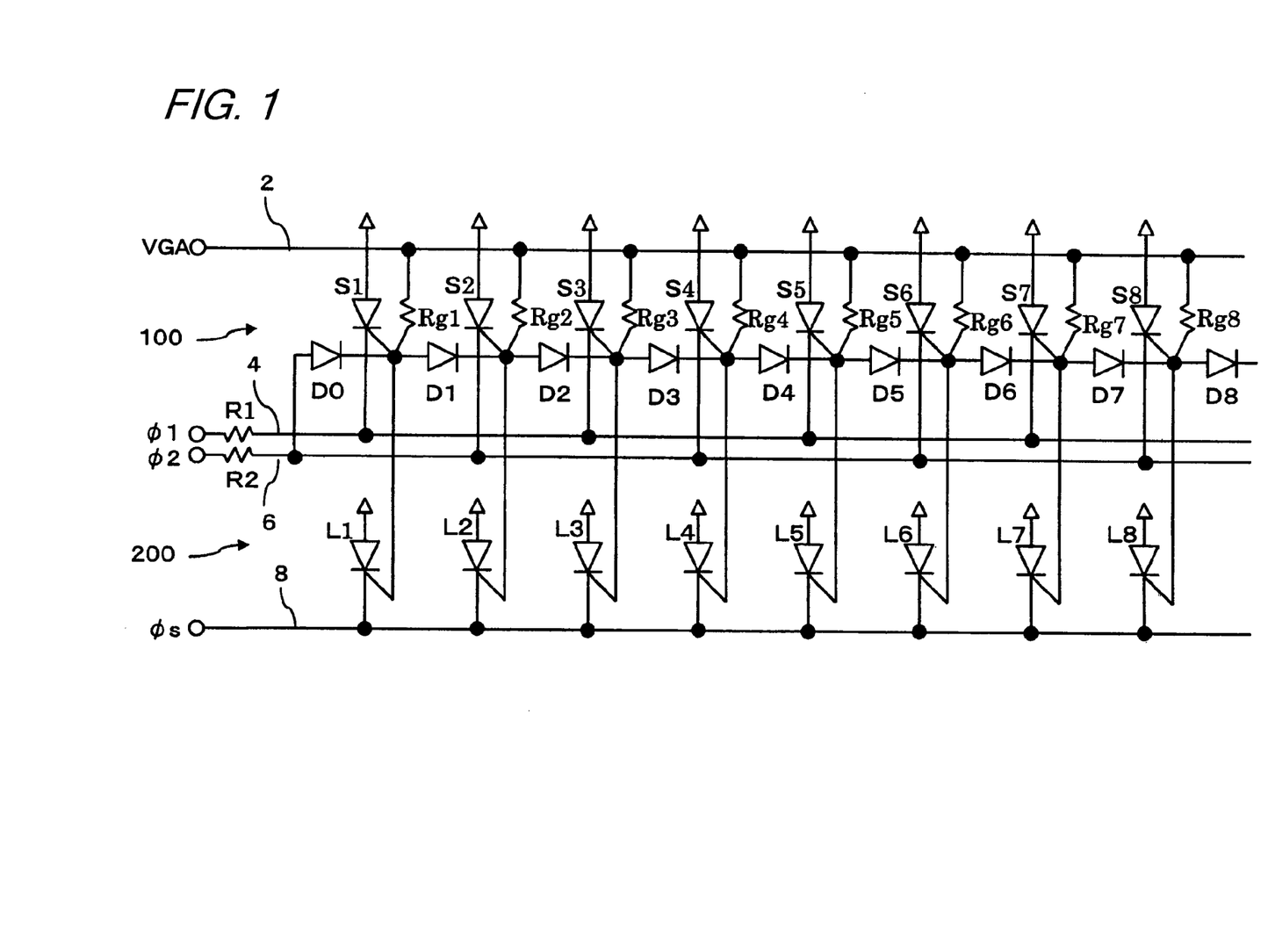
FIG. 1 is a diagram showing an equivalent circuit according to an exemplary embodiment.

FIG. 1 is an equivalent circuit diagram of a light-emitting element according to an exemplary embodiment (in the following description, a self-scanning-type light-emitting element array constructed from a plurality of light-emitting elements is also referred to as a light-emitting element). The self-scanning-type light-emitting element array includes a sift section 100 and a light-emitting section 200.

The sift section 100 includes: shift thyristors S1, S2, S3, . . . (S); coupling diodes D1, D2, D3, . . . (D) for linking the gates of the shift thyristors S with each other; and gate load resistors Rg. Here, as described later, each coupling diode D is formed as a layer fabricated together with the gate layer and the cathode layer of each shift thyristor S. Further, the gate of the first shift thyristor S1 is connected not only to the anode of the coupling diode D1 but also to the cathode of the diode DO. Furthermore, the light-emitting section 200 has light-emitting thyristors L1, L2, L3, . . . whose gates are formed in common with those of the corresponding shift thyristors S.

A power supply VGA is connected through a VGA line 2 to one end of each gate load resistor Rg. The other end of the gate load resistor Rg is connected to the gates of the corresponding shift thyristor S and the corresponding light-emitting thyristor L. A clock pulse φ1 is provided to the cathodes of the odd-number-th shift thyristors S1, S3, . . . via a current limiting resistor R1 and a φ1 line 4. A clock pulse φ2 is provided to the cathodes of the even-number-th shift thyristors S2, S4, . . . via a current limiting resistor R2 and a φ2 line 6. Further, the cathodes of the light-emitting thyristors L1, L2, . . . are connected to a φs line 8. Here, the anodes of the shift thyristors S and the light-emitting thyristors L are connected to an anode power supply.

Further, the gate of each shift thyristor S is sequentially connected through a coupling diode D to the gate of the shift thyristor S of the next stage. Here, the gate of the first shift thyristor S1 is connected through a coupling diode D1 to the φ2 line 6.

Figure 7:
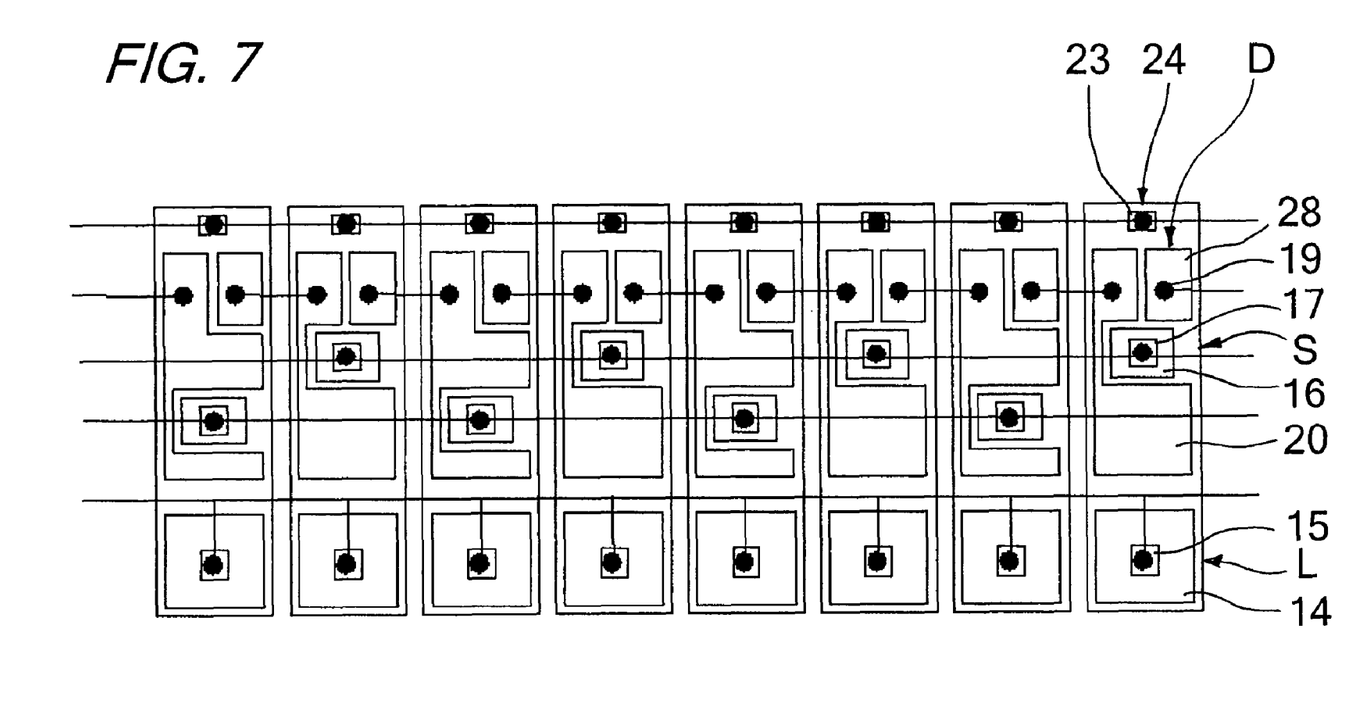
FIG. 7 is a diagram showing a plan view of a light-emitting element according to another exemplary embodiment.

In this specification, the self-scanning-type light-emitting element array chip shown in FIG. 7 is also referred to as an SLED (Self-scanning Light-emitting Device).

In the SLED, as the clock pulses T1 and T2, complementary pulse signals are employed that alternate an H level and an L level.

For example, in FIG. 1, it is assumed that the φ2 line 6 and the VGA line 2 are at an L level (−5 V), that the φ1 line is at an H level (0 V), and that the shift thyristor S2 is ON. Then, the gate of the shift thyristor S2 is at an H level (e.g., 0 V). At that time, the gate of the shift thyristor S3 is, for example, at −1.5 V in view of a voltage drop equal to the ON-state voltage of the coupling diode D2, while the voltage of the gate of the shift thyristor S4 is approximately −3 V which is lower than the voltage of the gate of the shift thyristor S3 by the ON-state voltage of the coupling diode D3.

Then, when the φ2 line 6 becomes an H level and the φ1 line 4 becomes an L level, the shift thyristor S2 becomes OFF and the shift thyristor S3 becomes ON. Thus, the gate of the shift thyristor S3 becomes, for example, 0 V. Then, the gate of the shift thyristor S4 becomes −1.5 V in view of a voltage drop equal to the ON-state voltage of the coupling diode D2. Further, the gate of the shift thyristor S2 in OFF state becomes the level of the power supply VGA through the gate load resistor Rg. As such, when the clock pulses φ1 and φ2 alternately become an L level, the shift thyristors S sequentially become ON.

Here, at an initial step, when the φ1 line 4 is set at an L level and the φ2 line 6 is set at an H level, the shift thyristor S1 becomes ON. After that, when the φ1 line 4 and the φ2 line 6 are switched alternately between an L level and an H level, self-scan is achieved in the shift thyristors S as described above.

Here, in each light-emitting thyristor L, a signal φs is provided to the cathode. Then, when the signal φs is at an L level, a light-emitting thyristor L whose corresponding shift thyristor S is ON becomes ON. That is, when the corresponding shift thyristor S is ON, the common gate is at an H level. Thus, the light-emitting thyristor L also becomes ON. In contrast, in a case that the signal φs is at an H level, even when the corresponding shift thyristor S is ON, the cathode of the light-emitting thyristor L is at an H level and hence the light-emitting thyristor L remains OFF.

As such, in the course that the shift thyristors S sequentially go ON, when the signal φs is set at an H level or an L level, light emission of the light-emitting thyristors L is controlled.

Figure 2:
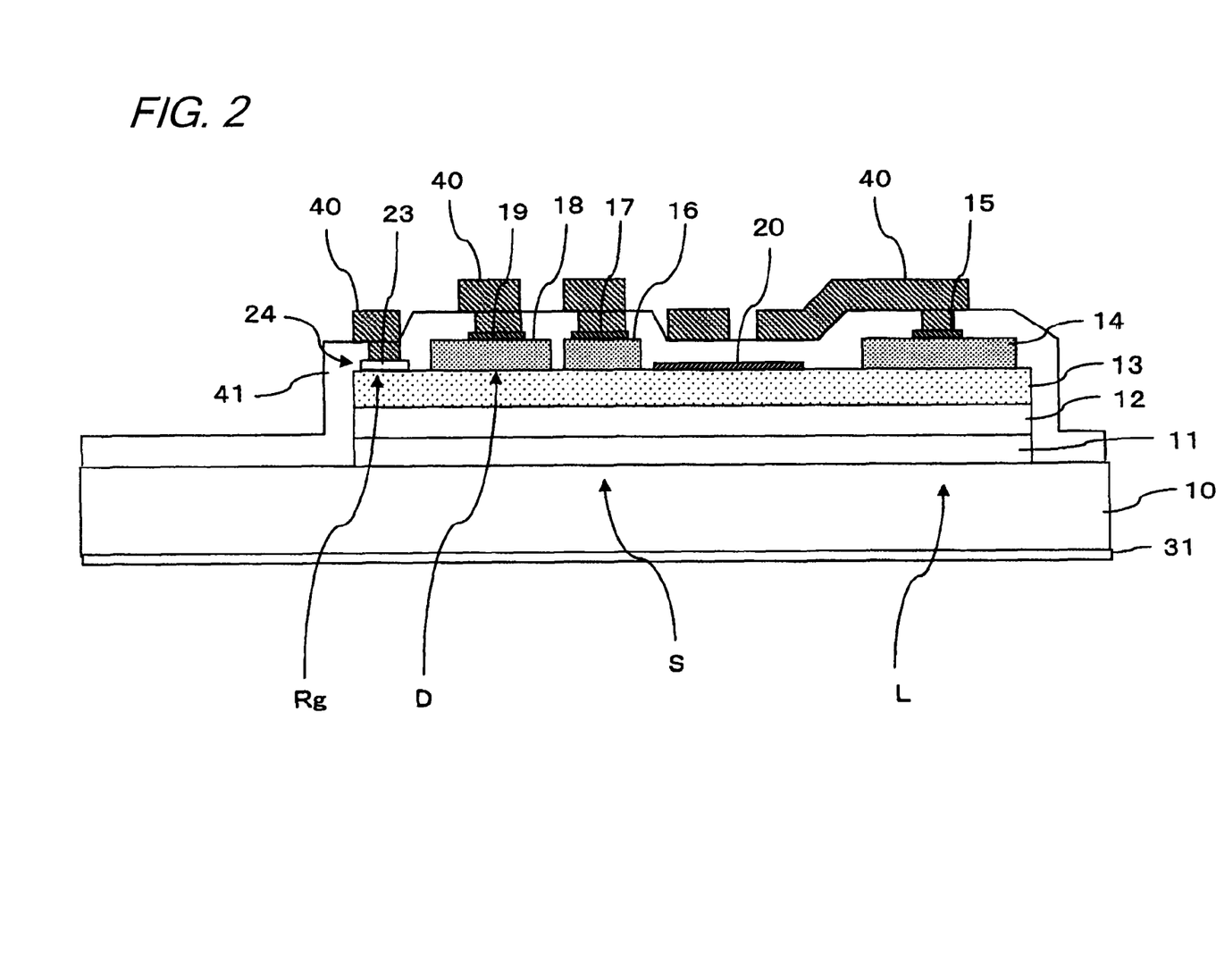
FIG. 2 is a diagram showing a sectional view of a light-emitting element according to an exemplary embodiment.
Figure 3:
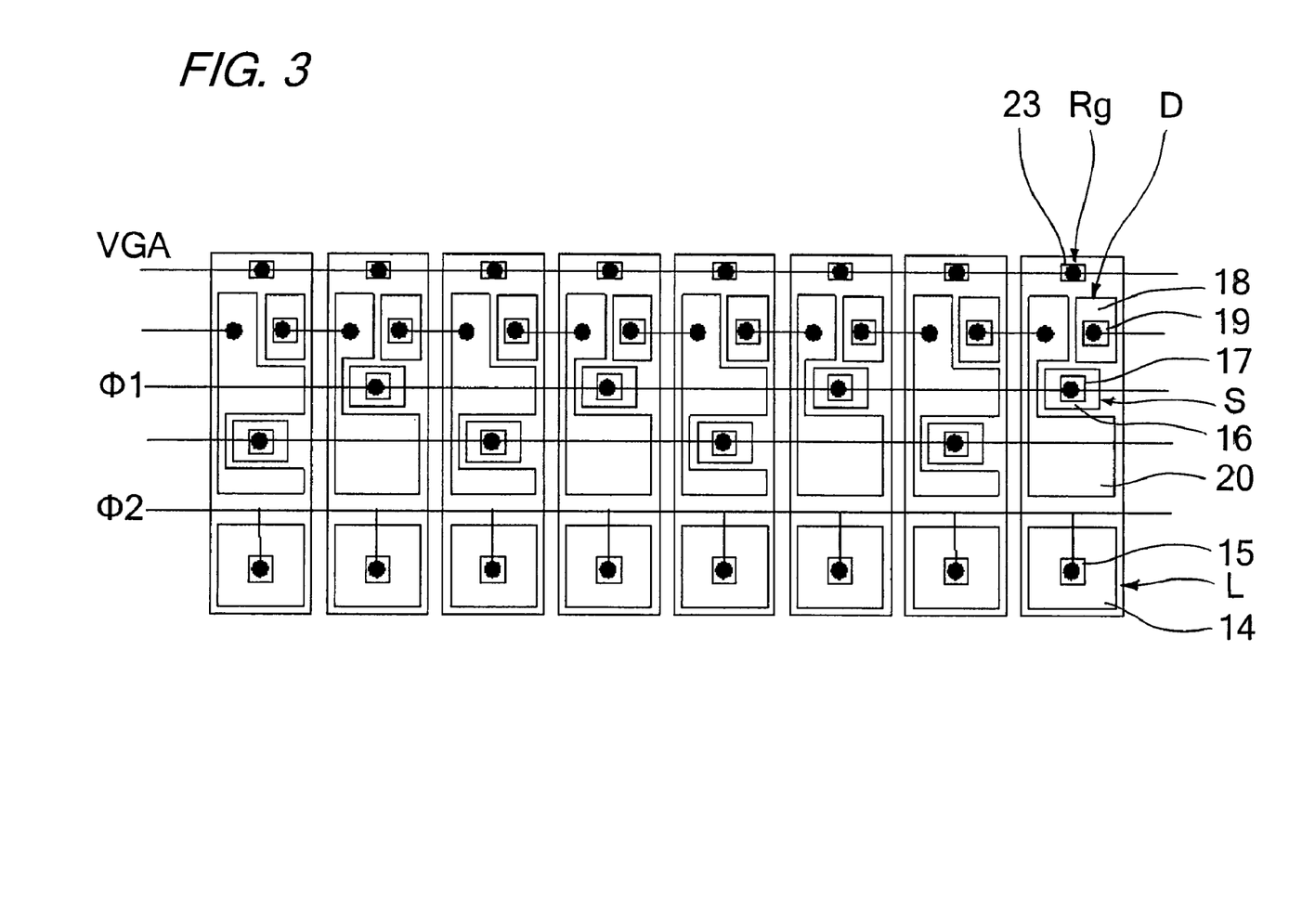
FIG. 3 is a diagram showing a plan view of a light-emitting element according to an exemplary embodiment.

FIG. 2 is a sectional view of a main part of the light-emitting element according to an exemplary embodiment. FIG. 3 is a plan view showing a plurality of light-emitting elements. This light-emitting element is of an anode-common type employing a p-type substrate 10.

On the p-type substrate 10, as shown in FIG. 2, a p-type epitaxial layer (anode layer) 11, an n-type epitaxial layer (n-type gate layer) 12, a p-type epitaxial layer (p-type gate layer) 13, and n-type epitaxial layers (cathode layers) 14, 16, and 18 are stacked in this order.

The cathode layer 14 constitutes the cathode layer of the light-emitting thyristor L. The cathode layer 16 constitutes the cathode layer of the shift thyristor S. The cathode layer 18 constitutes the cathode layer of the coupling diode D.

Further, on the cathode layer 14, the cathode electrode 15 of the light-emitting thyristor L is formed. On the cathode layer 16, the cathode electrode 17 of the shift thyristor S is formed. On the cathode layer 18, the cathode electrode 19 of the coupling diode D is formed.

Further, on the rear surface of the p-type substrate 10, a back electrode (anode) 31 is formed and serves as the shift thyristor S and the anode of the light-emitting thyristor L. Furthermore, on the p-type epitaxial layer (p-type gate layer) 13, a gate electrode 20 is formed and serves as the gate electrode of the common gate of the shift thyristor S and the light-emitting thyristor L.

Then, on the p-type gate layer 13, a Schottky electrode 23 is formed so that a Schottky diode 24 allowing a current to flow from the p-type gate layer to an aluminum wiring trace 40 is formed as the gate load resistor Rg.

As shown in FIG. 3, the Schottky electrode 23 of each gate load resistor Rg is connected to the power line VGA, while the gate electrode 20 is connected to the cathode electrode 19 of the adjacent element. Further, the cathode electrode 17 of the shift thyristor S is connected to the φ1 line 4, while the cathode electrode 15 of the light-emitting thyristor L is connected to the signal line φs. Furthermore, in the adjacent light-emitting element, the cathode electrode 17 of the shift thyristor S is connected to the control line, that is, the φ2 line.

That is, as for the T1 and φ2 lines, the φ1 line is connected to the cathode electrodes 17 of the odd-number-th ones of the light-emitting elements arranged in line, while the φ2 line is connected to the cathode electrodes 17 of the even-number-th light-emitting elements. Further, the cathode electrode 19 of each coupling diode D is connected to the gate electrode 20 of the adjacent element.

Then, in inter-electrode wiring, aluminum wiring traces are used. That is, an interlayer insulation film 41 is formed such as to cover the entirety of the light-emitting elements. Then, contact openings are formed in the interlayer insulation film 41 on the electrodes. After that, aluminum wiring traces 40 are formed such as to cover the contact openings in a pattern set up in advance.

Here, in the cathode layer 14 and in the cathode electrodes 15, 17, and 19 and the gate electrode 20 formed on the p-type gate layer 13, ohmic contact is achieved by employing gold electrodes.

As such, according to the present exemplary embodiment, the gate load resistor Rg includes a Schottky diode formed when the aluminum wiring trace of the power line VGA is connected through the Schottky electrode 23 to the p-type gate layer 13. In the related art, a gate load resistor portion is formed separate from a light-emitting thyristor portion. Then, a p-type epitaxial layer formed simultaneously at a process step for the p-type gate layer 13 in the gate load resistor portion has been used for forming the gate load resistor. This has causes a relatively large area of the gate load resistor Rg.

According to the present exemplary embodiment, immediately under the aluminum wiring trace of the power line VGA, the gate load resistor Rg includes the Schottky diode 24. This remarkably reduces the area occupied by the gate load resistor Rg.

Figure 4:
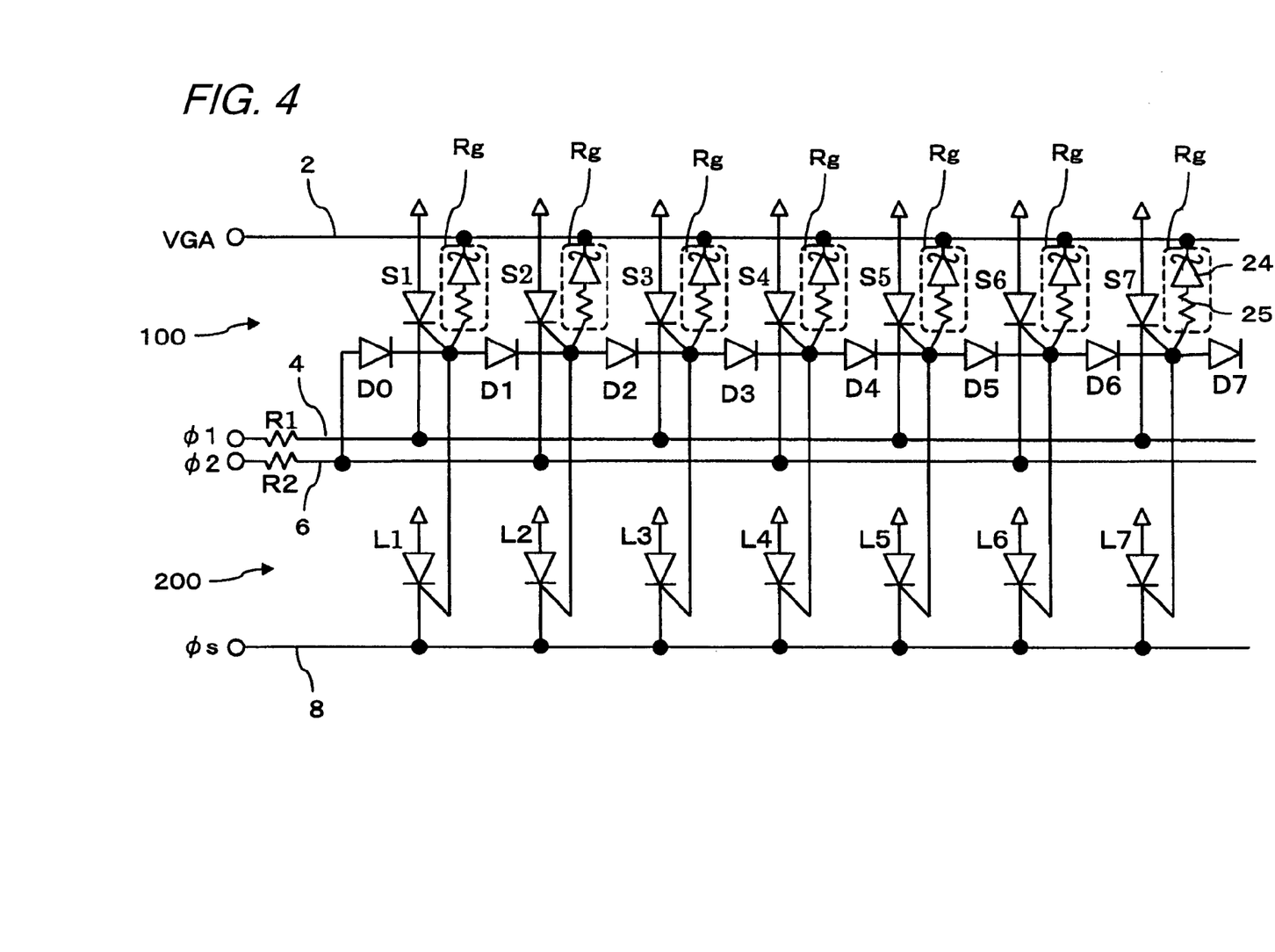
FIG. 4 is a diagram showing an equivalent circuit of a light-emitting element according to an exemplary embodiment.

FIG. 4 shows an equivalent circuit in the present exemplary embodiment. As such, the gate load resistor Rg includes the Schottky diode 24 and the resistor 25. Here, the resistor 25 is a series resistor extending from the Schottky diode 24 to the p-type gate layer 13 of the light-emitting thyristor.

Figure 5:
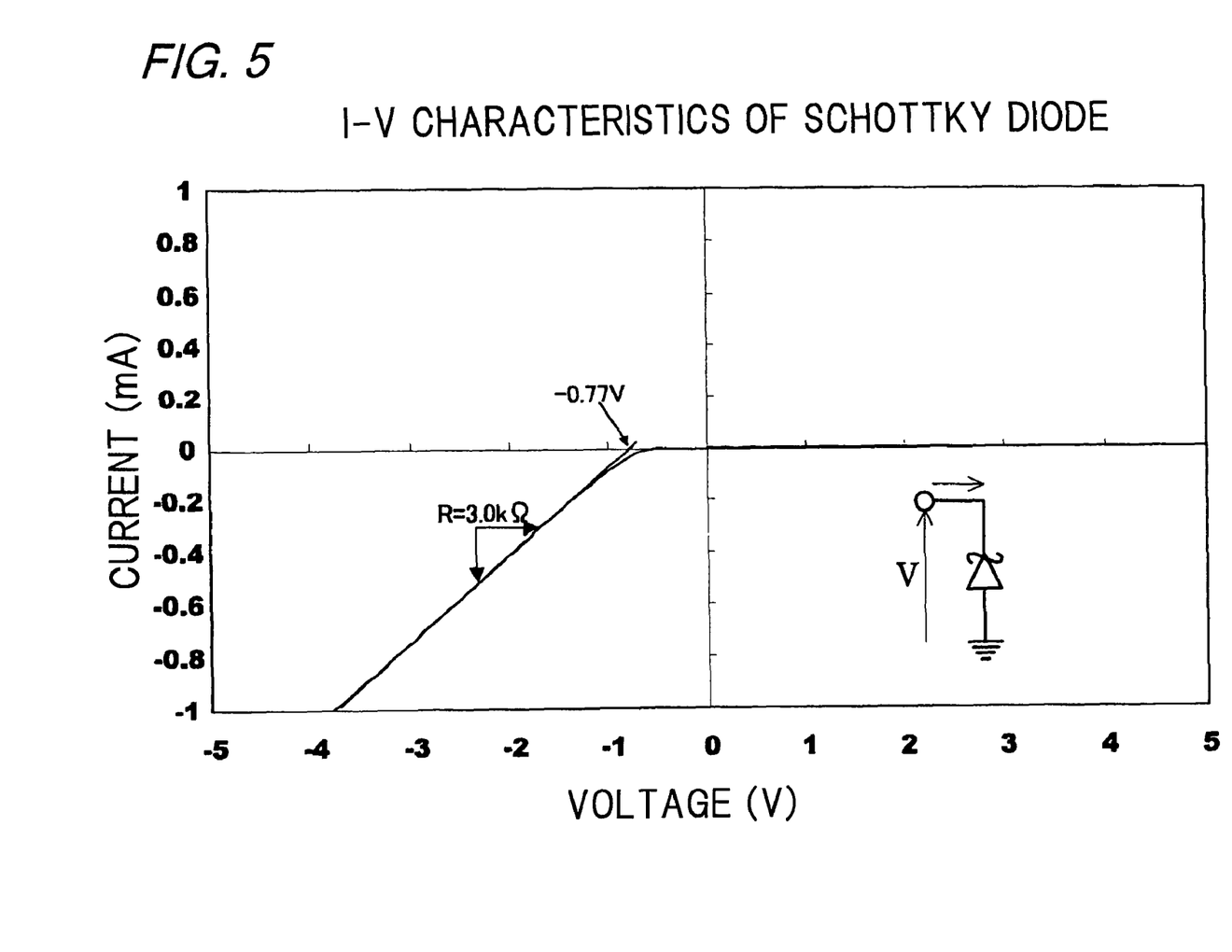
FIG. 5 is a diagram showing I-V characteristics of a Schottky diode.

Here, a Schottky structure of an Al electrode having a contact area of 2 μm×2 μm was fabricated on the p-type gate layer 13, and then its I-V characteristics were investigated.

Results are shown in FIG. 5. As seen from FIG. 5, the forward voltage is −0.77 V and the series parasitic resistance was approximately 3.0 kΩ. Then, with assuming that VGA=−3.3 V and the ON-state gate voltage=−0.3 V, the current corresponding to −3 V read from the diagram is approximately −0.6 mA. As such, the Schottky electrode 23 serves as a replacement of the gate load resistor Rg.

Au, Al, Pt, Ti, Mo, W, WSi, and TaSi may be used in Schottky electrode materials.

Other Exemplary Embodiments

Figure 6:
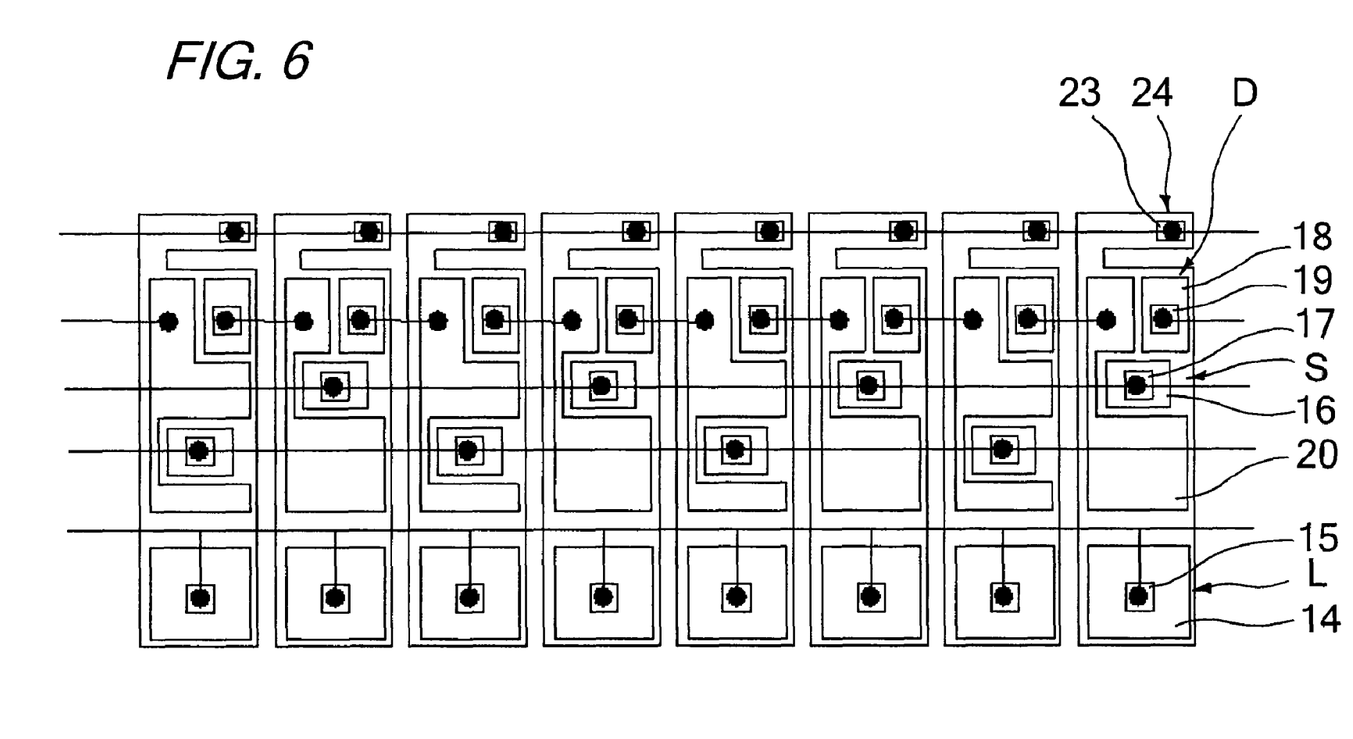
FIG. 6 is a diagram showing a plan view of a light-emitting element according to another exemplary embodiment.

FIG. 6 shows a configuration according to another exemplary embodiment. In this exemplary embodiment, the Schottky electrode 23 is located in an edge portion of the light-emitting element. Then, a notch where at least the p-type gate layer 13 is removed is provided between the Schottky electrode 23 and the light-emitting thyristor and the like so that the path extending from the Schottky electrode 23 to the p-type gate layer of the light-emitting thyristor L forms an elongated p-type gate layer 13 which has an increased resistance. This resistance increases with decreasing size of the Schottky electrode 23. Nevertheless, an excessively small size causes difficulty in controlling the size of the contact part, and hence fluctuation in the resistance. In the present exemplary embodiment, even when a relatively large size of the Schottky electrode 23 is adopted, a relatively high overall resistance is obtained.

Figure 8:
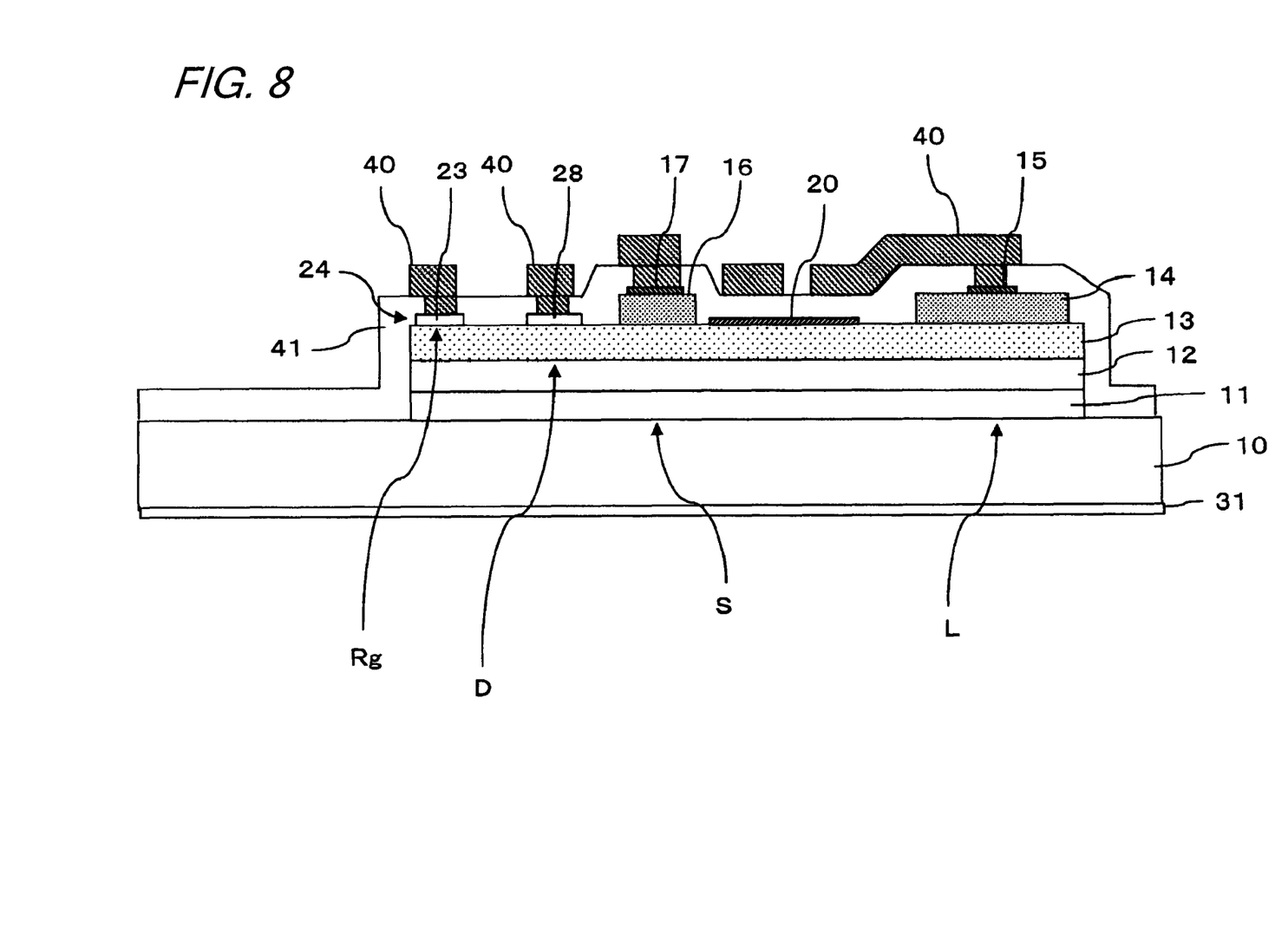
FIG. 8 is a diagram showing a sectional view of a light-emitting element according to the exemplary embodiment shown in FIG. 7.

FIG. 7 shows a configuration according to yet another exemplary embodiment. In this exemplary embodiment, the coupling diode D includes a Schottky diode. That is, the coupling diode D is formed by forming a Schottky electrode 23 on the p-type gate layer 13 and then connecting the electrode to an aluminum wiring trace 40. FIG. 8 shows its sectional view. As shown in the figure, in the coupling diode D, the cathode layer 18 is removed, then a Schottky electrode 28 is formed on the p-type gate layer 13, and then the Schottky electrode 28 is connected to an aluminum wiring trace 40.

According to the present exemplary embodiment, the coupling diode D also can be constructed in the form of a Schottky diode. Thus, the magnitude of the voltage drop here is selectable. This permits higher flexibility in the setting of the shift operation in the shift thyristor S.

Figure 9:
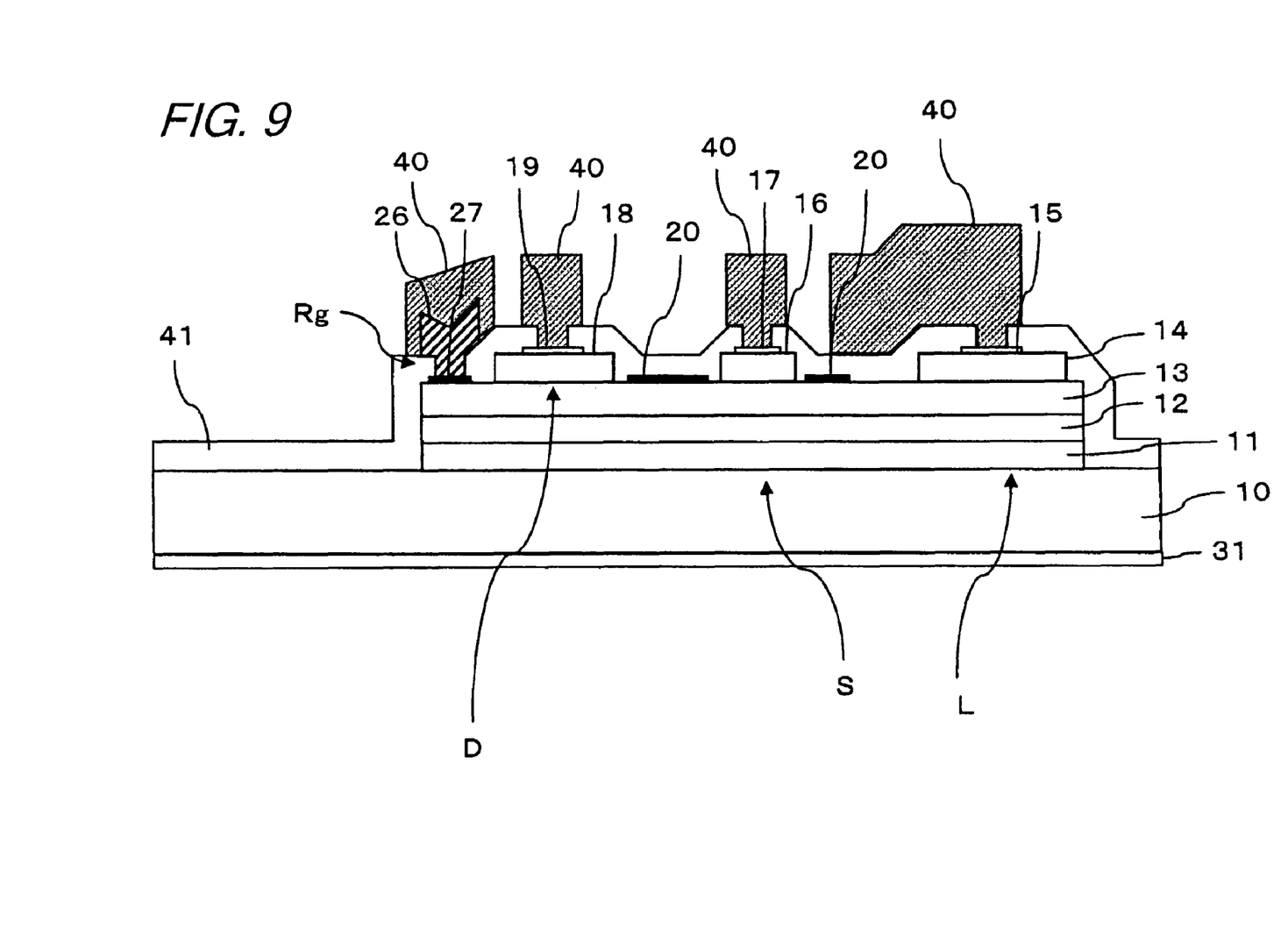
FIG. 9 is a diagram showing a sectional view of a light-emitting element according to another exemplary embodiment.

FIG. 9 shows yet another exemplary embodiment. In this example, a resistor film 26 is provided in place of the Schottky electrode 23. That is, the gate load resistor Rg is located between a gold electrode 27 formed on the p-type gate layer 13 and an aluminum wiring trace 40. Thus, when the resistor film 26 serves as a vertical type gate load resistor Rg, the necessity of detouring of the p-type gate layer 13 is avoided.

Figure 10:
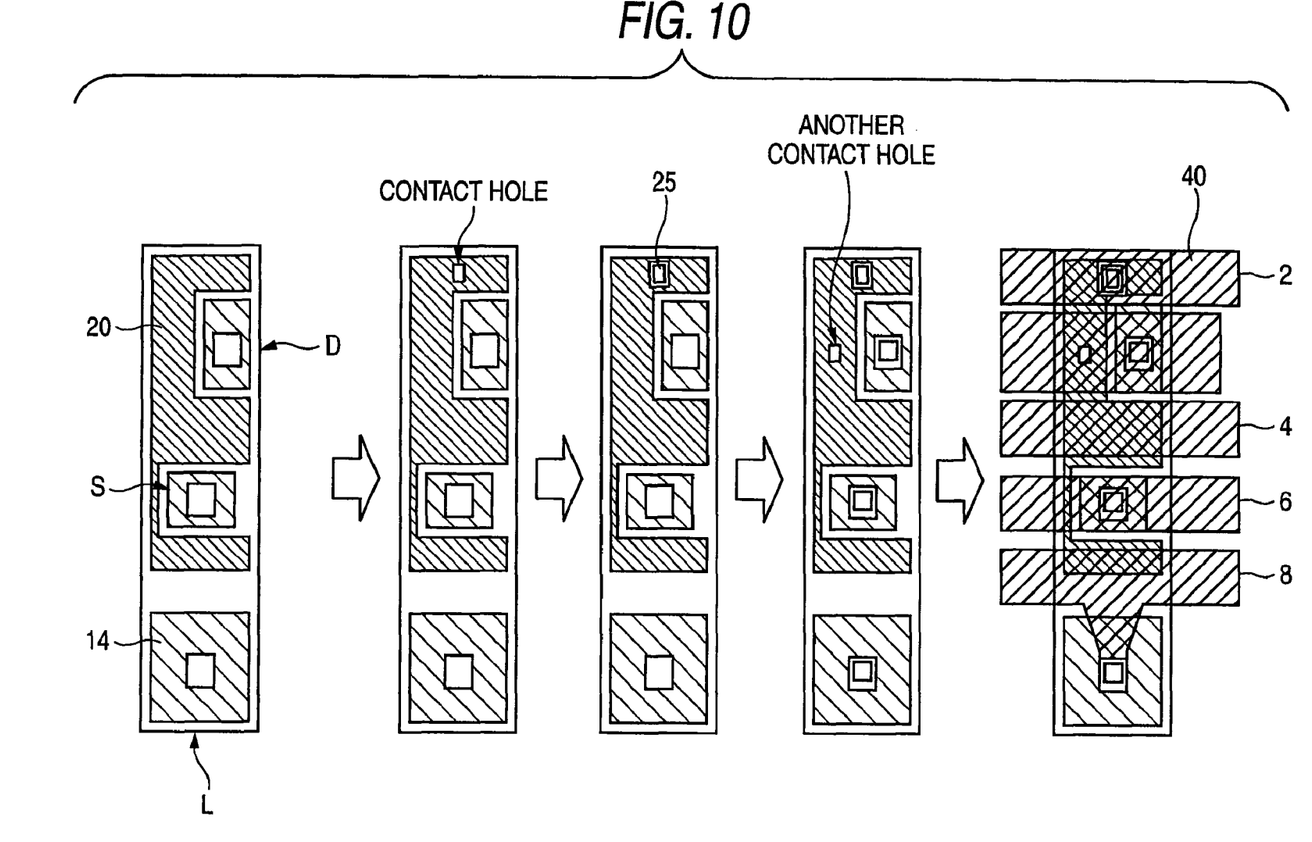
FIG. 10 is a plan view describing fabrication processes for a light-emitting element according to the exemplary embodiment shown in FIG. 9.
Figure 11:
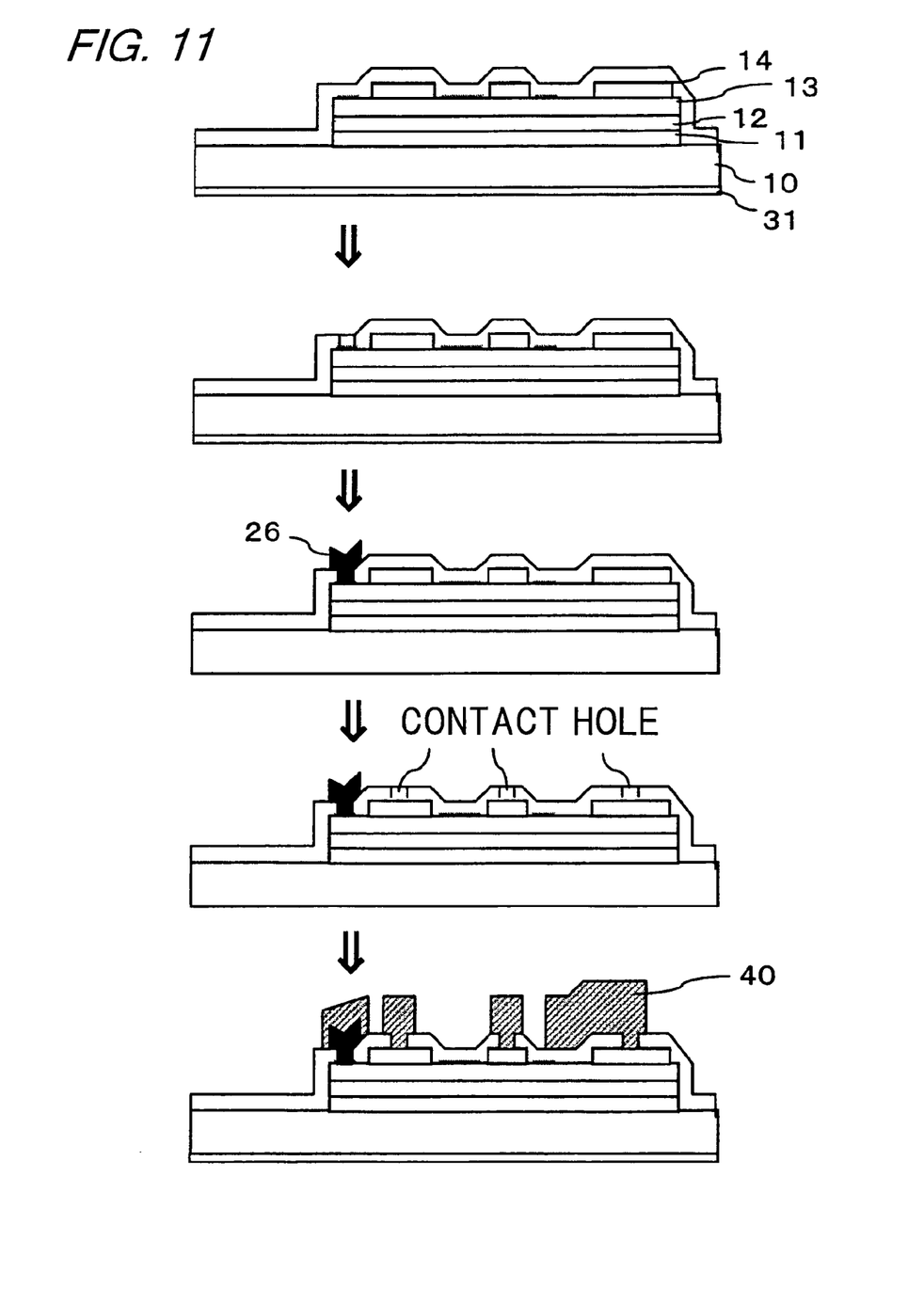
FIG. 11 is a sectional view describing fabrication processes for a light-emitting element according to the exemplary embodiment shown in FIG. 9.

FIGS. 10 and 11 show a formation process for the element according to the exemplary embodiment of FIG. 9. Process steps until the formation of contacts with the aluminum wiring traces have been completed. Further, the gold electrodes 27, 19, 17, 20, and 15 and the interlayer insulation film 41 composed of $SiO_2$ have already been fabricated. Starting from this state, first, a contact hole that reaches the gold electrode 27 is fabricated in the part where the gate load resistor Rg of the interlayer insulation film 41 is to be formed. Then, a resistor film 26 is formed in the contact hole. This resistor film 26 is fabricated in such a manner that a resistor film is formed by spattering or the like such as to cover the entire surface including the contact hole formed as described above. Then, the resistor film is removed by etching except for the part above the contact hole. At that time, the resistor film is preserved in a somewhat larger area than the contact hole such that the resistor film somewhat overlaps with the interlayer insulation film 41. Here, the resistor film 26 is fabricated, for example, from amorphous silicon, cermet (Cr-.SiO, Ta.SiO, Nb.SiO), $RuO_2$, TaN, or the like.

Then, another contact hole is formed on another electrode. Then, an aluminum film is formed on the entire surface including the contact hole and the resistor film 26. After that, this film is removed except for a predetermined part so that a desired aluminum wiring trace 40 is formed.

In this exemplary embodiment, in place of the use of the Schottky electrode 23 as a resistor, the resistor film 26 is formed on the ohmic electrode (the gold electrode 27), and then connection is formed by the aluminum wiring trace 40.

This configuration also realizes a vertical type gate load resistor.

Specifically, the vertical type gate load resister, which is the resistor film 26, extends along a direction crossing at least the p-type gate layer 13.

Here, the examples in the exemplary embodiments given above have been described for the case of a pnpn structure employing a p-type substrate. Instead, the p-property and the n-property may be inverted. That is, an npnp structure employing an n-type substrate may be employed. In this case, the positions of the anode layer and the cathode layer are also interchanged. That is, the cathode layer is common to the shift thyristor and the light-emitting thyristor, while the anode layer of the shift thyristor is formed separate from that of the light-emitting thyristor.

The light emitting element in the above exemplary embodiment is not limited to be used in an image forming apparatus using electrophotographic system. For example, the light emitting element may be used in, display, lighting, optical communication, and optical writing except electrophotographic recoding.

What is claimed is:

1. A light-emitting element comprising:
   a shift thyristor that includes a first anode layer, a first gate layer, and a first cathode layer and that is turned ON and OFF in accordance with a potential of the first gate layer in a state that a voltage is applied between the first anode layer and the first cathode layer;
   a light-emitting thyristor that includes a second anode layer, a second gate layer, and a second cathode layer and that is turned ON in response to the potential of the second gate layer when the shift thyristor becomes ON, the second gate layer and the first gate layer being composed of a single layer, one of the second anode layer and the second cathode layer being provided as a common layer to the first anode layer or the first cathode layer, the other one of the second anode layer and the second cathode layer being provided as a layer separate from the first anode layer and the first cathode layer; and
   a gate load resistor that is arranged on the first gate layer under a power line and that limits a current flowing from the first gate layer and the second gate layer to the power line, the gate load resistor including a Schottky diode generated by arranging a Schottky electrode between the first gate layer and the power line,
   the Schottky electrode being in contact with the first and second gate layers.

2. The light-emitting element according to claim 1, wherein the gate load resistor includes a thin film resistor provided between the first gate layer and the power line.

3. The light-emitting element according to claim 2, wherein the thin film resistor extends along a direction crossing the first gate layer.

4. The light-emitting element according to claim 1, wherein a portion of the first gate layer between the Schottky electrode and the light-emitting thyristor is removed so that a path extending from the Schottky electrode to the first gate layer forms an elongated contact part between the Schottky electrode and the light-emitting thyristor.

* * * * *